United States Patent
Mondal et al.

(10) Patent No.: US 10,873,162 B2
(45) Date of Patent: *Dec. 22, 2020

(54) OVERVOLTAGE PROTECTION FOR UNIVERSAL SERIAL BUS TYPE-C (USB-C) CONNECTOR SYSTEMS

(71) Applicant: Cypress Semiconductor Corporation, San Jose, CA (US)

(72) Inventors: Partha Mondal, Paschim Medinipur (IN); Arun Khamesra, Bangalore (IN); Hemant P. Vispute, Bangalore (IN)

(73) Assignee: Cypress Semiconductor Corporation, San Jose, CA (US)

(*) Notice: Subject to any disclaimer, the term of this patent is extended or adjusted under 35 U.S.C. 154(b) by 76 days.

This patent is subject to a terminal disclaimer.

(21) Appl. No.: 16/240,489

(22) Filed: Jan. 4, 2019

(65) Prior Publication Data
US 2019/0319410 A1 Oct. 17, 2019

Related U.S. Application Data

(63) Continuation of application No. 16/016,937, filed on Jun. 25, 2018, now Pat. No. 10,218,129.
(Continued)

(51) Int. Cl.
*H01R 13/66* (2006.01)
*G06F 13/38* (2006.01)
(Continued)

(52) U.S. Cl.
CPC ....... *H01R 13/6666* (2013.01); *G06F 13/385* (2013.01); *G06F 13/4022* (2013.01);
(Continued)

(58) Field of Classification Search
CPC ... H01R 13/6666; H01R 33/97; G06F 13/385; G06F 13/4022; G06F 13/4282;
(Continued)

(56) References Cited

U.S. PATENT DOCUMENTS 9,088,158 B2 7/2015 Maggio et al.
10,218,129 B1* 2/2019 Mondal ............... G06F 13/4282
(Continued)

FOREIGN PATENT DOCUMENTS

CN 105954644 A 9/2016
CN 106026006 A 10/2016
(Continued)

OTHER PUBLICATIONS

"TPD8S300 USB Type-C Port Protector: Short-to-Vbus Overvoltage and IEC ESD Protection," Texas Instrument, ti.com [online], Nov. 2016, pp. 1-34; 34 pages.
(Continued)

*Primary Examiner* — Dharti H Patel

(57) ABSTRACT

An example electronic device includes a first switch and a second switch that are each coupled to an overvoltage detection and protection circuit. The first switch is configured to connect a first sideband use (SBU) terminal of a Universal Serial Bus Type-C (USB-C) controller to a SBU crossbar switch of the USB-C controller. The second switch is configured to connect a second SBU terminal of the USB-C controller to the SBU crossbar switch. The overvoltage detection and protection circuit is configured to deactivate the first switch or the second switch when a voltage exceeding a predetermined threshold is detected on a terminal of the first switch or the second switch.

20 Claims, 6 Drawing Sheets

Related U.S. Application Data

(60) Provisional application No. 62/681,513, filed on Jun. 6, 2018, provisional application No. 62/655,988, filed on Apr. 11, 2018.

(51) Int. Cl.
   *G06F 13/42* (2006.01)
   *H01R 33/97* (2006.01)
   *H01L 27/02* (2006.01)

(52) U.S. Cl.
   CPC ......... *G06F 13/4282* (2013.01); *H01R 33/97* (2013.01); *H03K 19/00315* (2013.01); *H03K 19/018507* (2013.01); *H03K 19/018557* (2013.01); *H01L 27/0266* (2013.01)

(58) Field of Classification Search
   CPC ..... H03K 19/00315; H03K 19/018507; H03K 19/018557; H01L 27/0266
   USPC .......................................................... 361/18
   See application file for complete search history.

(56) References Cited

U.S. PATENT DOCUMENTS

| | | | |
|---|---|---|---|
| 2016/0190794 A1* | 6/2016 | Forghani-Zadeh | .... H02H 9/048 361/86 |
| 2017/0060216 A1 | 3/2017 | Waters et al. | |
| 2017/0147526 A1* | 5/2017 | Chen | ........................ G06F 11/36 |
| 2017/0155214 A1 | 6/2017 | Shen et al. | |
| 2017/0293335 A1 | 10/2017 | Dunstan et al. | |
| 2017/0317583 A1 | 11/2017 | Forghani-zadeh et al. | |
| 2017/0346240 A1 | 11/2017 | Oporta et al. | |
| 2018/0019587 A1 | 1/2018 | Chen et al. | |
| 2018/0152183 A1 | 5/2018 | Vemula | |
| 2018/0241096 A1 | 8/2018 | Kaechi | |
| 2018/0341309 A1* | 11/2018 | Sporck | ................ G06F 13/4295 |

FOREIGN PATENT DOCUMENTS

| | | |
|---|---|---|
| CN | 205826789 U | 12/2016 |
| CN | 106300314 A | 1/2017 |
| CN | 106445044 A | 2/2017 |
| CN | 207148821 U | 3/2018 |

OTHER PUBLICATIONS

International Search Report for International Application No. PCT/US18/62059 dated Jan. 4, 2019, 3 pages.

USPTO Notice of Allowance for U.S. Appl. No. 16/016,937 dated Oct. 3, 2018, 8 pages.

Written Opinion of the International Searching Authority for International Application No. PCT/US18/62059 dated Jan. 4, 2019, 4 pages.

* cited by examiner

OVERVOLTAGE PROTECTION FOR UNIVERSAL SERIAL BUS TYPE-C (USB-C) CONNECTOR SYSTEMS

CROSS-REFERENCE TO RELATED APPLICATIONS

This application is a continuation of U.S. Non-Provisional application Ser. No. 16/016,937, filed on Jun. 25, 2018, which claims the priority and benefit of U.S. Provisional Application No. 62/655,988, filed on Apr. 11, 2018, and of U.S. Provisional Application No. 62/681,513, filed on Jun. 6, 2018, all of which are incorporated by reference herein in their entirety.

TECHNICAL FIELD

Aspects of the present disclosure generally relate to Universal Serial Bus (USB) Type-C connector subsystems, and more particularly, to overvoltage protection for USB Type-C connector subsystems.

BACKGROUND

Various electronic devices (e.g., such as smartphones, tablets, notebook computers, laptop computers, hubs, chargers, adapters, etc.) are configured to transfer power through a Universal Serial Bus Type-C (USB-C) connector system. For example, in some applications an electronic device may be configured as a power consumer to receive power through a USB-C connector system (e.g., for battery charging), while in other applications an electronic device may be configured as a power provider to provide power to another device that is connected thereto through a USB-C connector system. Electronic devices are typically configured to transfer power through Field Effect Transistors (FETs), or other similar switching devices. In some instances, the FETs may become susceptible to electrical damage (e.g., overcurrent damage, overvoltage damage, overheating damage, and so forth) due to, for example, one or more electrical faults possibly occurring on the USB-C connector system.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
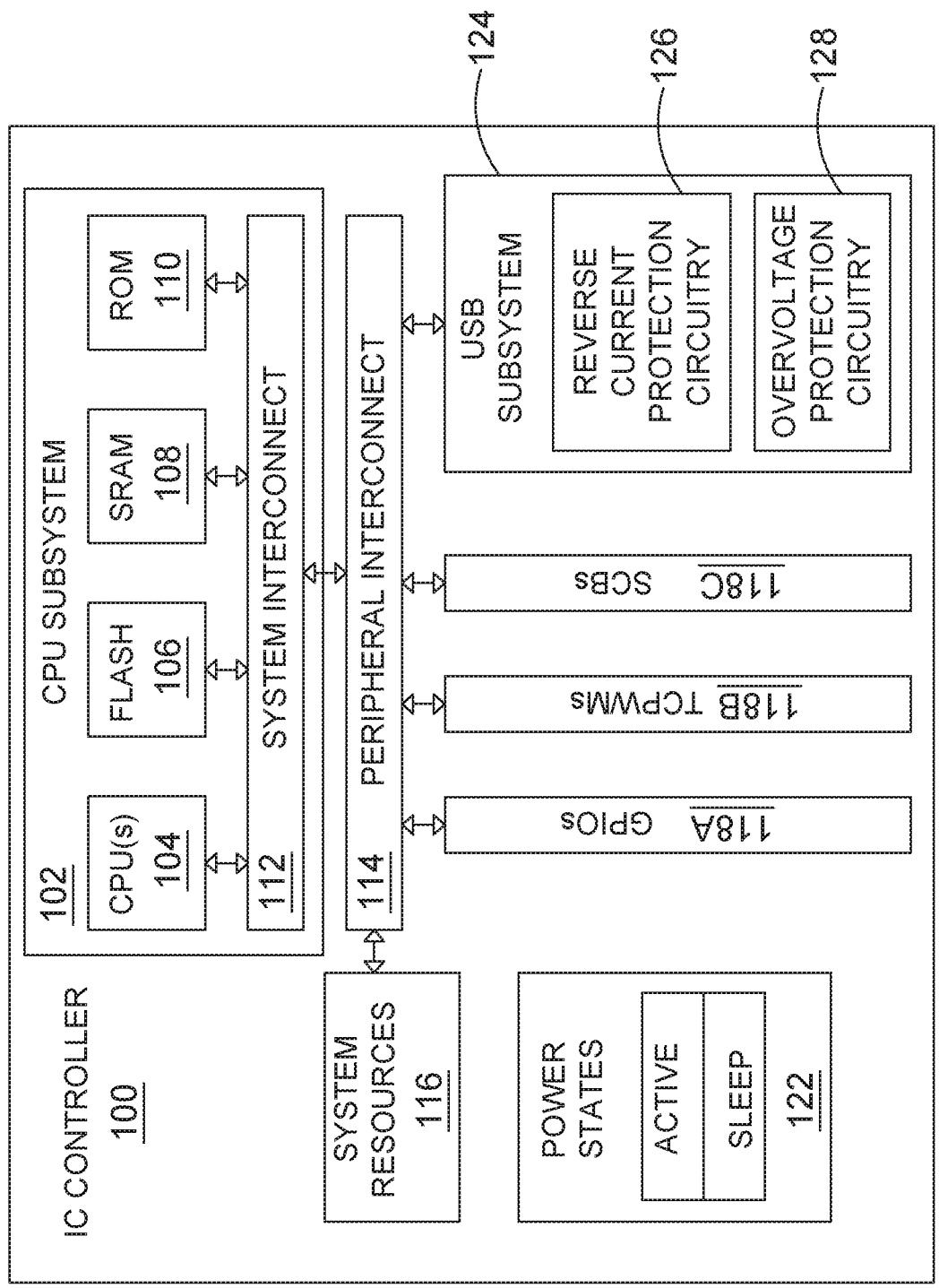
FIG. 1 is a block diagram that illustrates integrated circuit (IC) controller system, in accordance with the present embodiments.

Described herein are herein are various embodiments of techniques for overvoltage protection for USB-C in electronic devices. Examples of such electronic devices include, without limitation, personal computers (e.g., laptop computers, notebook computers, and so forth), mobile computing devices (e.g., tablets, tablet computers, e-reader devices, and so forth), mobile communication devices (e.g., smartphones, cell phones, personal digital assistants, messaging devices, pocket PCs, and so forth), connectivity and charging devices (e.g., hubs, docking stations, adapters, chargers, etc.), audio/video/data recording and/or playback devices (e.g., cameras, voice recorders, hand-held scanners, monitors, and so forth), and other similar electronic devices that can use USB connectors (interfaces) for communication and/or battery charging.

As used herein, an electronic device or a system is referred to as "USB-enabled" if the electronic device or system complies with at least one release of a Universal Serial Bus (USB) specification. Examples of such USB specifications include, without limitation, the USB Specification Revision 2.0, the USB 3.0 Specification, the USB 3.1 Specification, and/or various supplements (e.g., such as On-The-Go, or OTG), versions and errata thereof. The USB specifications generally define the characteristics (e.g., attributes, protocol definition, types of transactions, bus management, programming interfaces, and so forth) of a differential serial bus that are required to design and build standard communication systems and peripherals.

For example, a USB-enabled peripheral electronic device attaches to a USB-enabled host device through a USB port of the host device to form a USB-enabled system. A USB 2.0 port may include a power line (e.g. $V_{BUS}$) of 5V, a differential pair of data lines (e.g., which may be denoted D+ or DP, and D− or DN), and a ground line (e.g., GND) for power return. A USB 3.0 port also provides the $V_{BUS}$, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (e.g., which may be denoted DPWR), and a ground line for power return (e.g., which may be denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

An emerging technology for USB connectors, called USB Type-C, was recently defined in various releases of the USB Type-C specification. The various releases of the USB Type-C specification define USB Type-C receptacle, plug, and cables that can support USB communications as well as power delivery over newer USB power delivery protocols defined, for example, in one or more revisions USB Power Delivery (USB-PD) specifications.

Some electronic devices may be compliant with a specific release and/or version of the USB Type-C specification. As used herein, a "USB Type-C subsystem" may refer to, for example, hardware circuitry that may be controllable by firmware and/or software in an integrated circuit (IC) controller, which is configured and operable to perform the functions and to satisfy the requirements specified in at least one release of the USB Type-C specification. Examples of such Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, and so forth. According to the USB Type-C specification(s), a Type-C port provides VBUS, D+, D−, GND, SSTX+, SSTX−, SSRX+, and SSRX− lines, among others.

In addition, a Type-C port also provides a Sideband Use (e.g., which may be denoted SBU) line for signaling of sideband functionality and a Configuration Channel (denoted CC) line for discovery, configuration, and management of connections across a Type-C cable. A Type-C port may be associated with a Type-C plug and with a Type-C receptacle. For ease of use, the Type-C plug and the Type-C receptacle are designed as a reversible pair that operates regardless of the plug-to-receptacle orientation. Thus, a standard Type-C connector, disposed as a standard Type-C plug or receptacle, provides pins for four VBUS lines, four ground return (GND) lines, two D+ lines (DP1 and DP2), two D− lines (DN1 and DN2), two SSTX+ lines (e.g., SSTXP1 and SSTXP2), two SSTX− lines (SSTXN1 and SSTXN2), two SSRX+ lines (e.g., SSRXP1 and SSRXP2), two SSRX− lines (SSRXN1 and SSRXN2), two CC lines (CC1 and CC2), and two SBU) lines (e.g., SBU1 and SBU2), among others.

Some electronic devices may be compliant with a specific revision and/or version of the USB-PD specification. The USB-PD specification defines a standard protocol designed to enable the maximum functionality of USB-enabled devices by providing more flexible power delivery thereto/therefrom along with data communications over a single Type-C cable through USB Type-C ports. For example, the USB-PD specification describes the architecture, protocols, power supply behavior, parameters, and cabling necessary for managing power delivery over USB Type-C cables at up to 100 W of power. According to the USB-PD specification, USB-enabled devices may negotiate for more current and/or higher or lower voltages over a USB Type-C cable than are defined in older USB specifications. As used herein, "USB-PD subsystem" may, in some embodiments, refer to hardware circuitry that may be controllable by firmware and/or software in an integrated circuit (IC) controller, which is configured and operable to perform the functions and to satisfy the requirements specified in at least one release of the USB-PD specification.

An electronic device typically uses a power-transfer circuit (power path) to transfer power to/from the device. Among other electronic components, a power path may include one or more power-FETs that are coupled in-line on the circuit path to operate as switches (e.g., as "ON"/"OFF" switches). Power-FETs differ in some important characteristics from FETs and other types of transistor switch devices that are used for other, non-power-transfer applications. As a discrete semiconductor switching device, a power-FET needs to carry a large amount of current between its source and its drain while it is "ON", to have low resistance from its source to its drain while it is "ON", and to withstand high voltages from its source to its drain while it is "OFF". For example, a power-FET may be characterized as being able to carry currents in the range of several hundred milliamps (e.g., 500-900 mA) to several amps (e.g., 3-10 A, or higher), and to withstand voltages in the range of 12V to 40V (or higher) across its source to its drain. For example, the resistance between the source and the drain of a power-FET device may be very small (e.g., in order of tens of milli-Ohms) to prevent, for example, the power loss across the device.

FIG. 1 illustrates an example device 100 that is configured in accordance with the techniques for overvoltage protection for USB-C circuits described herein. In the embodiment illustrated in FIG. 1, device 100 is an integrated circuit (IC) controller chip manufactured on an IC die. For example, IC controller 100 may be a single-chip IC device from the family of CCGx USB controllers developed by Cypress Semiconductor Corporation, San Jose, Calif. In another example, IC controller 100 may be a single-chip IC that is manufactured as a System-on-Chip (SoC).

Among other components, IC controller 100 may include CPU subsystem 102, peripheral interconnect 114, system resources 116, various input/output (I/O) blocks (e.g., 118A-118C), and USB subsystem 124. In addition, IC controller 100 provides circuitry and firmware that is configured and operable to support a number of power states 122. The CPU subsystem 102 may include one or more CPUs (central processing units) 104, flash memory 106, SRAM (Static Random Access Memory) 108, and ROM (Read Only Memory) 110 that are coupled to system interconnect 112. CPU 104 is a suitable processor that can operate in a system-on-chip device. In some embodiments, the CPU may be optimized for low-power operation with extensive clock gating and may include various internal controller circuits that allow the CPU to operate in various power states.

For example, the CPU may include a wake-up interrupt controller that is configured to wake the CPU from a sleep state, thereby allowing power to be switched "OFF" when the IC chip is in the sleep state. Flash memory 106 can be any type of program memory (e.g., NAND flash, NOR flash, and so forth) that is configurable for storing data and/or programs. SRAM 108 can be any type of volatile or non-volatile memory that is suitable for storing data and firmware/software instructions accessed by CPU 104. ROM 110 can be any type of suitable storage that is configurable for storing boot-up routines, configuration parameters, and other system-on-chip firmware parameters and settings. System interconnect 112 is a system bus (e.g., a single-level or multi-level Advanced High-Performance Bus, or AHB) that is configured as an interface that couples the various components of CPU subsystem 102 to each other, as well as a data and control interface between the various components of the CPU subsystem and peripheral interconnect 114.

Peripheral interconnect 114 is a peripheral bus (e.g., a single-level or multi-level AHB) that provides the primary data and control interface between CPU subsystem 102 and its peripherals and other resources, such as system resources 116, I/O blocks (e.g., 118A-118C), and USB subsystem 124. The peripheral interconnect may include various controller circuits (e.g., direct memory access, or DMA controllers), which may be programmed to transfer data between peripheral blocks without burdening the CPU subsystem. In various embodiments, each of the components of the CPU subsystem and the peripheral interconnect may be different with each choice or type of CPU, system bus, and/or peripheral bus.

System resources 116 may include various electronic circuits that support the operation of IC controller 100 in its various states and modes. For example, system resources 116 may include a power subsystem that provides the power resources required for each controller state/mode such as, for example, voltage and/or current references, wake-up interrupt controller (WIC), power-on-reset (POR), etc. In some embodiments, the power subsystem of system resources 116 may also include circuits that allow IC controller 100 to draw and/or provide power from/to external sources with several different voltage and/or current levels. System resources 116 may also include a clock subsystem that provides various clocks that are used by IC controller 100, as well as circuits that implement various controller functions such as external reset.

An IC controller, such as IC controller 100, may include various different types of I/O blocks and subsystems in various embodiments and implementations. For example, in the embodiment illustrated in FIG. 1, IC controller 100 may include GPIO (general purpose input output) blocks 118A, TCPWM (timer/counter/pulse-width-modulation) blocks 118B, SCBs (serial communication blocks) 118C, and USB subsystem 124. GPIOs 118A include circuits configured to implement various functions such as, for example, pull-ups, pull-downs, input threshold select, input and output buffer enabling/disabling, multiplex signals connected to various I/O pins, etc. TCPWMs 118B include circuits configured to implement timers, counters, pulse-width modulators, decoders and various other analog/mixed signal elements that are configured to operate on input/output signals. SCBs 118C include circuits configured to implement various serial communication interfaces such as, for example, I²C, SPI (serial peripheral interface), UART (universal asynchronous receiver/transmitter), and so forth.

In certain embodiments, the USB subsystem 124 may be utilized in accordance with the techniques for overvoltage protection described herein, and may also provide support for USB communications over USB ports, as well other USB functionality such as power delivery and battery charging. For example, in various embodiments USB subsystem 124 may be a USB-PD subsystem, a USB Type-C subsystem, or both (e.g., a USB Type-C subsystem that supports USB-PD functionality). USB subsystem 124 may include a Type-C transceiver and physical layer logic (PHY), which are configured as an integrated baseband PHY circuit to perform various digital encoding/decoding functions (e.g., Biphase Mark Code-BMC encoding/decoding, cyclical redundancy checks-CRC, and so forth) and analog signal processing functions involved in physical layer transmissions. The USB subsystem 124 may be referred to as a USB controller.

In certain embodiments, the IC controller 100 (and/or the USB subsystem 124) may also be configured to respond to communications defined in a USB-PD Specification such as, for example, SOP, SOP', and SOP" messaging. As will be further discussed below, the USB subsystem 124 may also include reverse current protection circuitry 126 (e.g., on-chip circuitry included as part of the USB subsystem 124) and the overvoltage protection circuitry 128 (e.g., on-chip circuitry included as part of the USB subsystem 124) to protect one or more components of the IC controller 100 from possible electrical damage (e.g., overcurrent damage, overvoltage damage, overheating damage, and so forth) due to, for example, one or more electrical faults possibly occurring on the IC controller 100.

The relatively small size and symmetric form factor of a Type-C receptacle and plug may increase the risk of CC/SBU lines becoming susceptible to fault currents due to high-voltage (e.g., up to 24V) on neighboring $V_{BUS}$ lines.

Once cable orientation detection is completed, one CC line becomes a $V_{CONN}$ line for cable/adapter power and other CC line is used for USB-PD communication. The resistance across a $V_{CONN}$ power switch should be low (e.g., <500 mΩ) to support the maximum power delivery of 1.5 W over 5V. To address these and other issues, in certain embodiments the overvoltage protection circuitry 128 (e.g., on-chip circuitry) of the USB subsystem 124 is configured to provide a high voltage (e.g., 20V) tolerant internal $V_{CONN}$/SBU switch with fast over-voltage detection (e.g., a few microseconds to a few nanoseconds) in order to turn "OFF" the internal $V_{CONN}$/SBU switch to avoid backflow current through, for example, a low impedance (e.g., <1Ω) internal switch like $V_{CONN}$/SBU switch. In this way, the internal $V_{CONN}$/SBU switch may provide an overvoltage protection scheme that may be provided to protect, for example, the $V_{CONN}$/SBU switch and $V_{CONN}$ supply, the chipset driver of side band signaling (SBU) signals from electrical and/or thermal damage (e.g., overvoltage damage, overheating damage, and so forth).

Figure 2:
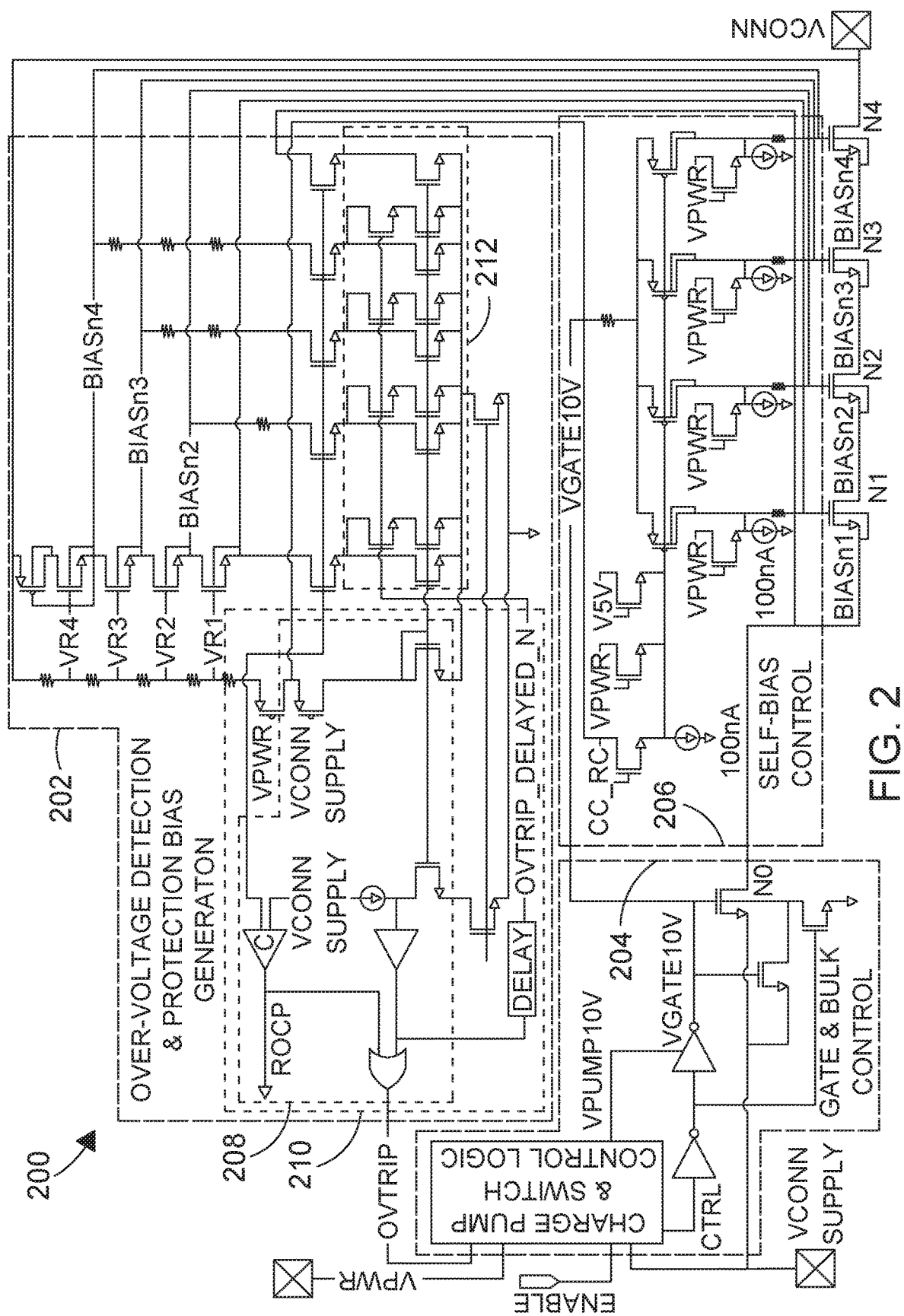
FIG. 2 is a detailed diagram that illustrates an IC controller system and USB-C connector systems, in accordance with the present embodiments.

Turning now to FIG. 2, a detailed embodiment of a USB subsystem 200 (e.g., USB Type-C subsystem) is provided. As depicted, the USB subsystem 200 (e.g., USB Type-C subsystem) may include an overcurrent and overvoltage detection and protection circuit stage 202, a gate and bulk control circuit stage for Vconn switch 204, and a self-bias control circuit stage 206. As depicted, the gate and bulk control circuit stage 204 may include various electronic components (e.g., charge pump and switch control logic, one or more amplifiers, one or more switches, and so forth) that may be utilized, for example, to turn "ON" the $V_{CONN}$ power-FETs by applying a gate voltage to one or more $V_{CONN}$ power-FETs. Similarly, the self-bias control circuit stage 206 may include (e.g., one or more power switches) that may be utilized, for example, to provide bias voltages to components of the overcurrent and overvoltage detection and protection circuit stage 202.

The overcurrent and overvoltage detection and protection circuit stage 202 may include on-chip reverse current detection and protection circuitry 208, comparator circuitry 210, and sink circuitry 212. In certain embodiments, as illustrated, the on-chip reverse current detection and protection circuitry 208 may include, for example, a comparator across a $V_{CONN}$ FET and $V_{CONN}$ supply. The gate and bulk control circuit stage 204 and the self-bias control circuit stage 206 may, in some embodiments, be utilized to support the overvoltage detection and protection circuit stage 202 to detect and compensate for overvoltage conditions.

For example, in some embodiments, the overcurrent and overvoltage detection and protection circuit stage 202 may include on-chip overvoltage detection and protection and comparator circuitry 210 and sink circuitry 212. The on-chip overvoltage detection and protection and comparator circuitry 210 may include, for example, a comparator across a $V_{CONN}$ FET and $V_{CONN}$ supply. In some embodiments, during, for example, overvoltage operating conditions, the comparator (e.g., current-based comparator) may detect overvoltage conditions based on, for example, an overvoltage detection signal (e.g., "ovtrip"), which is generated when $V_{CONN}$ voltage is detected as being higher than the VPWR node voltage by a configurable voltage threshold value (e.g., "ovtrip threshold"). In one embodiment, the comparator (e.g., current-based comparator) may detect overvoltage conditions within a response time of, for example, approximately 50 ns or less. Specifically, the overvoltage detection signal (e.g., "ovtrip") may be provided in order to switch "OFF" an internal isolation switch to reduce or substantially prevent the possibility of the backflow of current through the internal isolation switch.

The overvoltage detection and protection circuit 210 may be constructed by using cascoded series of NMOS (or PMOS) transistors in such a way that during fault condition when the $V_{CONN}$ voltage goes above the $V_{CONN}$ supply voltage (or when $V_{CONN}$ is shorted to higher voltage at system level to VBUS) the difference between the two voltages creates gate voltage biases for protecting the cascoded transistor switch transistors N1/2/3/4 in circuit stage 206. The gate generation biasing scheme consists of resistor divider generating voltage VR1, VR2, VR3, VR4 of circuit stage 202 from the $V_{CONN}$ pin. The VR1/2/3/4 resistor divider generates biases biasn1, biasn2, biasn3 and biasn4 for the cascoded switches N1, N2, N3, N4 of stage 206 through NMOS source followers of stage 202. The voltage levels generated through biasn1, biasn2, biasn3 and biasn4 are such that they don't exceed the gate oxide voltage limit set by given technology node for N1/2/3/4 (e.g., such as 5V in 120 nm technology node). Thus, during a fault condition when the $V_{CONN}$ voltage is at 20V (or higher than the $V_{CONN}$ supply voltage), the biasn1, biasn2, biasn3 and biasn4 divides the $V_{CONN}$ voltage to generate the gate biases for the cascade switches N1/2/3/4 of stage 206, thus protecting the switch from overvoltage condition damage.

Figure 3:
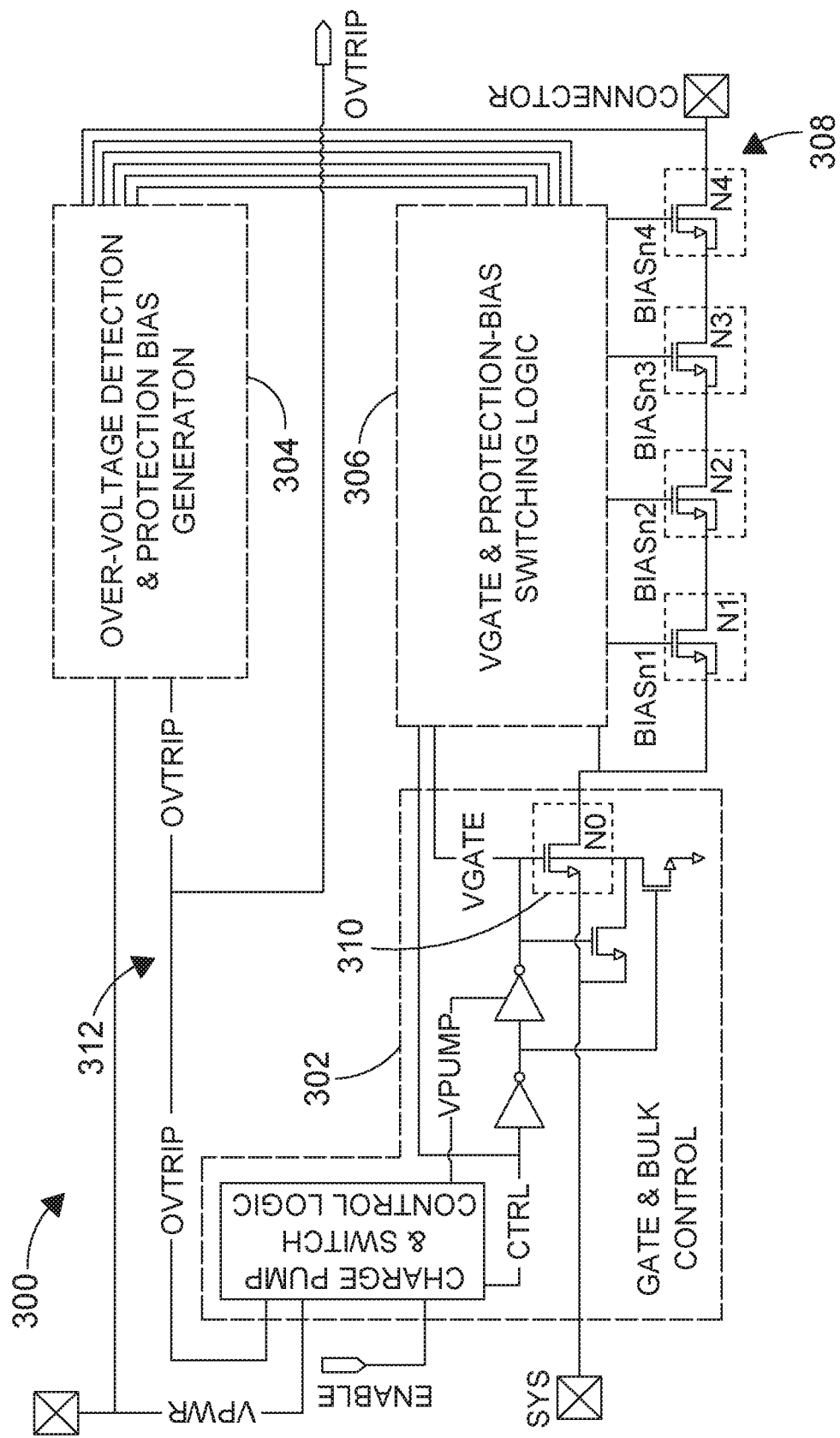
FIG. 3 is a diagram that illustrates an embodiment of a overvoltage protection system for USB-C connector systems, in accordance with the present embodiments.

Turning to FIG. 3, a high-level diagram of a USB subsystem 300 (e.g., USB Type-C subsystem) including an overvoltage detection and protection scheme in accordance with the present embodiments is provided. As depicted, the USB subsystem 300 may include a gate and bulk control stage 302 (including an N-FET isolation switch 310), overvoltage detection and protection bias generation stage 304, a $V_{GATE}$ and protection bias switching logic stage 306, and a number of cascode N-FET switches 308 (e.g., N1, N2, N3, N4). Each of the cascade switches 308 may be constructed as an NMOS transistor placed in super high voltage (SHV) deep N-well.

In certain embodiments, the gate and bulk control stage 302 may control, for example, the voltage on the N-FET isolation switch 310. During normal operational switch "OFF" condition, each the gate and the bulk of isolation N-FET isolation switch 310 may be connected to GND to turn "OFF" the switch. On the other hand, during normal operational switch "ON" condition, the gate of the N-FET isolation switch 310 may be connected to $V_{CHARGE}$ PUMP (e.g., at 5V during operation) and the bulk of the N-FET isolation switch 310 may be connected locally. In some embodiments, the overvoltage detection and protection bias generation stage 304 may be utilized to provide bias voltages to, for example, the $V_{GATE}$ and protection bias switching logic stage 306 to detect and compensate for overvoltage conditions. For example, during a 24V fault condition, both the gate and the bulk of the N-FET isolation switch 310 are set at 0V and thus there would be no back current through the switch.

For example, during overvoltage conditions (e.g., when a $V_{BUS}$ line at 20V shorts to CC1/2 or SBU1/2 lines), the overvoltage detection and protection bias generation stage 304 may generate an overvoltage signal 312 (e.g., "ovtrip") and adaptive gate biasing voltages (e.g., biasn1, biasn2, biasn3, biasn4) for the number of cascade N-FET switches 308 (e.g., N1, N2, N3, N4). In some embodiments, the overvoltage detection and protection bias generation stage 304 may include, for example, one or more analog multiplexers (MUX) that switch between $V_{CHARGE}$ PUMP and protection voltage bias (e.g., biasn1, biasn2, biasn3, biasn4) during, for example, overvoltage conditions.

In certain embodiments, the number of cascode N-FET switches 308 (e.g., N1, N2, N3, N4) may be provided to clamp (e.g., upwardly limit) each internal node to, for example, a maximum voltage of 3V-5V. In this way, during overvoltage operating conditions, the comparator (e.g., current-based comparator) may detect overvoltage conditions based on, for example, an overvoltage detection signal (e.g., "ovtrip"), which is generated when that $V_{CONN}$ voltage is detected as being higher than the VPWR node voltage by a configurable voltage threshold value (e.g., "ovtrip threshold") with a substantially fast response time (e.g., approximately 50 ns or less). Specifically, the overvoltage detection signal (e.g., "ovtrip") may be provided in order to switch "OFF" the N-FET isolation switch 310 to reduce or substantially prevent the possibility of the backflow of current through the N-FET isolation switch 310.

Figure 4:
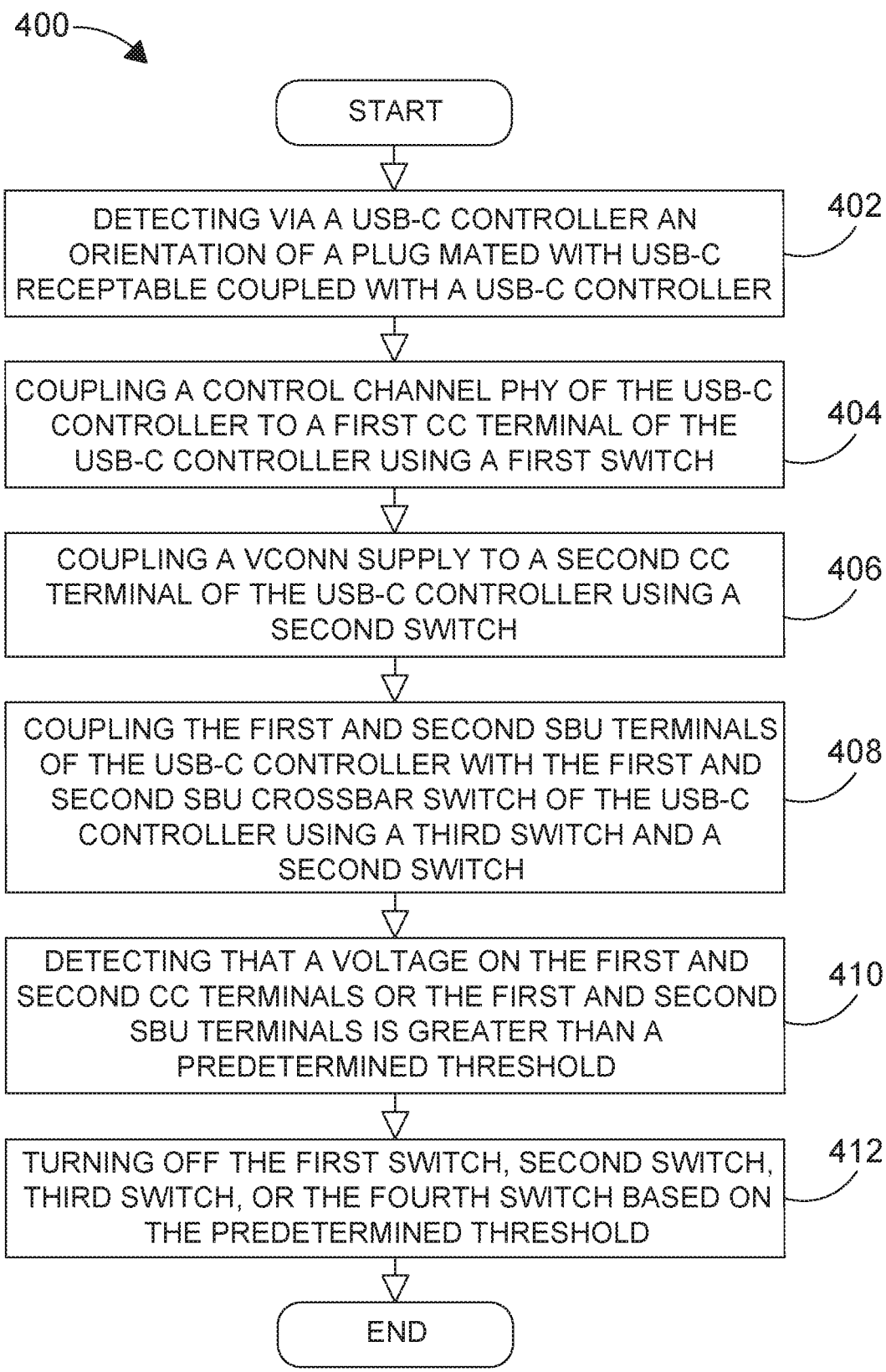
FIG. 4 is a flow diagram of a method of an overvoltage protection scheme for USB-C connector systems, in accordance with the present embodiments.

Turning now to FIG. 4, which illustrates a flow diagram of a method 400 of providing overvoltage detection and protection in accordance with the present embodiments. In certain embodiments, the method 400 may be performed by processing logic (e.g., IC controller 100 of FIG. 1 and IC controller 604 and Type-C receptacle 630 of FIG. 6) that may include hardware such as the USB subsystem 200 (e.g., USB Type-C subsystem) discussed above with respect to FIG. 2. Indeed, in some embodiments, the method 400 may be performed utilizing hardware, software, or combinations of hardware and software.

The method 400 may begin with the IC controller 100 detecting an orientation of a plug mated with a USB-C receptacle coupled with a USB-C controller (block 402). The method 400 may then continue with the IC controller 100 coupling a control channel PHY of the USB-C controller to a first CC terminal of the USB-C controller using a first switch (block 404). The method 400 may then continue with the IC controller 100 coupling a $V_{CONN}$ supply to a second CC terminal of the USB-C controller using a second switch (block 406). The method 400 may then continue with the IC controller 100 coupling the first and second SBU terminals of the USB-C controller with the corresponding terminals of a SBU crossbar switch of the USB-C controller using third and fourth switches (block 408). The method 400 may then continue with the IC controller 100 detecting that a voltage level on any one of the CC or SBU terminals is greater than a predetermined threshold amount (block 410). The method 400 may then conclude with the IC controller 100 turning off the first, second, third, or fourth switch corresponding to the terminal on which the overvoltage was detected (block 412). In this way, the present method 400 may provide an overvoltage protection scheme to protect, for example, the $V_{CONN}$ switch and $V_{CONN}$ supply from electrical and/or thermal damage (e.g., overvoltage damage, overheating damage, and so forth).

Figure 5:
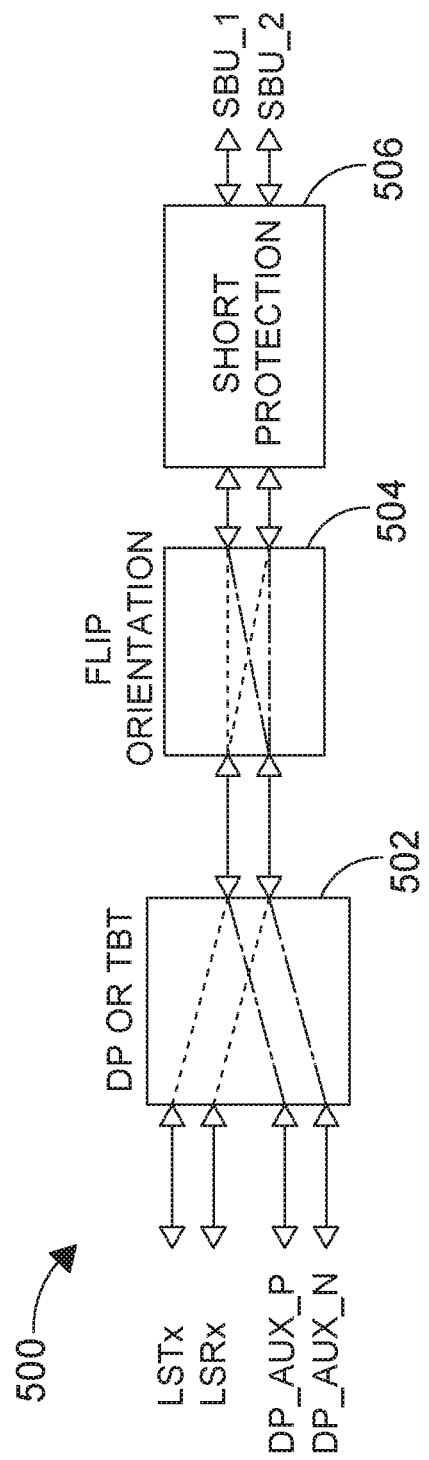
FIG. 5 is a block diagram of a SBU crossbar switch for USB-C connector systems, in accordance with the present embodiments.

In certain embodiments, as illustrated by FIG. 5, it may be useful to describe the present techniques with respect to a block diagram of a SBU crossbar switch 500 as illustrated by FIG. 5. For example, the SBU crossbar switch 500 may include a SBU switch MUX (e.g., 2×1 MUX) and a single 2×2 cross bar SBU switch per the Type-C port. In some embodiments, as further illustrated by FIG. 5, the SBU crossbar switch 500 may include Display Port or Thunderbolt block 502 that may allow selections between the Display Port or Thunderbolt modes and the routing signals to the appropriate SBU1 and/or SBU2 based on CC (e.g., Type-C plug) orientation (e.g., via either orientation) as determined by a flip orientation block 504. In some embodiments, in accordance with the present techniques, the fault protection block 506 of the SBU crossbar switch 500 and control circuit stages for $V_{CONN}$ switches and self-bias generation logic (e.g., such as stages 202, 206 of $V_{CONN}$ switch block 200) may be provided as reverse current protection and overvoltage protection schemes (e.g., implemented for each orientation and each direction of signal path).

The techniques for overvoltage protection described herein may be embodied in several different types of USB Type-C applications. Examples of such types of Type-C applications include, but may not be limited to: a downstream facing port (DFP) USB application, in which an IC controller with a USB Type-C subsystem is configured to provide a downstream-facing USB port (e.g., in a USB-enabled host device); an upstream facing port (UFP) USB application, in which an IC controller with a USB Type-C subsystem may be utilized to provide an upstream-facing USB port (e.g., in a USB-enabled peripheral device or adapter); and a dual role port (DRP) USB application, in which an IC controller with a USB Type-C subsystem is configured to support both DFP and UFP applications on the same USB port.

Figure 6:
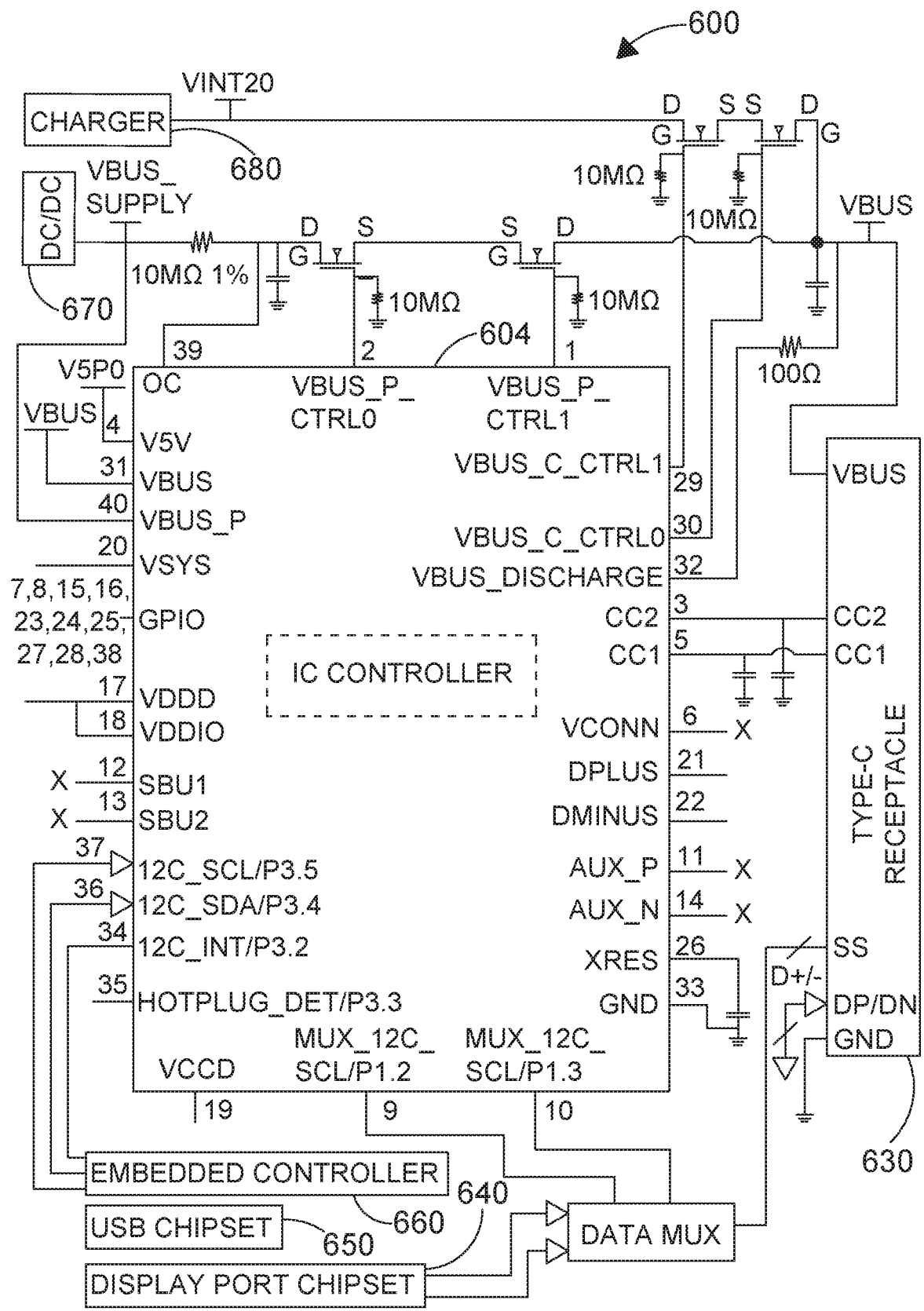
FIG. 6 is a block diagram of an example apparatus that may perform one or more of the operations described herein, in accordance with the present embodiments.

FIG. 6 illustrates an example system 600 in which IC controller 604 with a USB Type-C subsystem and a USB-PD subsystem is configured to provide a DRP application. In an example embodiment, IC controller 604 may be a single-chip IC device from the family of CCGx USB controllers developed by Cypress Semiconductor Corporation, San Jose, Calif. In system 600, IC controller 604 is coupled to Type-C receptacle 630, to display port chipset 640, to USB chipset 650, to embedded controller 660, to power supply 670, and to charger 680. These components of system 600 may be disposed on a printed circuit board (PCB) or other suitable substrate, and are coupled to each other by suitable means such conductive lines, traces, buses, etc.

In certain embodiments, the Type-C receptacle 630 may be configured in accordance with a USB Type-C specification to provide connectivity through a Type-C port. Display port chipset 640 is configured to provide a DisplayPort functionality through the Type-C receptacle 630. USB chipset 650 is configured to provide support for USB communications (e.g., such as USB 2.0 communications) through the D+/− lines of Type-C receptacle 630. Embedded controller 660 is coupled to IC controller 604 and is configured to provide various control and/or data transfer functions in system 600. The Power supply 670 may include a DC/DC power source that is coupled to the IC controller 604.

In certain embodiments, as previously discussed above, the IC controller 604 may include on-chip high-voltage overvoltage detection and protection to carry out the overvoltage protection techniques as described above. For example, as illustrated in FIG. 6, because the overvoltage detection and protection circuitry is constructed as part of the IC controller 604 (e.g., on-chip), in some embodiments, singular PHY control channels may couple the respective CC1 and CC2 terminals of the IC controller 804 via a "direct connection" (e.g., which may herein refer to an electric connection via or including a passive component such as a resistor or capacitor, but without any electrical connection via an active component such as a diode or transistor) to the respective CC1 and CC2 terminals of the Type-C receptacle 630.

Specifically, by enabling the respective CC1 and CC2 pins of IC controller 604 to be directly connected (e.g., without the utilization of any active electronic component, which further constitutes a reduction of hardware) to the respective CC1 and CC2 pins of the Type-C receptacle 630 and by including the overvoltage detection and protection as part of the IC controller 604 (e.g., on-chip), the present techniques may reduce, for example, response time, BOM, and power consumption of the system 600.

It should be understood that various embodiments may provide various mechanisms to facilitate the programmability, re-configurability, and/or re-programmability of an IC controller 604 (and of its various components) that operates in accordance with the techniques for overvoltage protection described herein. Indeed, programmability may be used to alter thresholds, slew rates, current sensing sensitivity, and for adding conditions and functionality after production (e.g., for field upgrades). For example, some embodiments may store configuration and/or program data in logic circuits that are enabled/disabled by using resistor-based fuses that are trimmed when the IC controller 604 is manufactured. Examples of such fuses include laser fuses, e-fuses, and non-volatile latches that have some characteristics of fuses and some characteristics of non-volatile memory. In some embodiments, pin-strapping may be used to facilitate the programmability of the IC controller 604. A pin-strapping mechanism may involve connecting (e.g., via jumpers or PCB traces) a number of controller pins/terminals to power or ground to have each input provide a binary value to the IC controller 604, where the collection of the provided input values is used configuration data to configure or program one or more components of the IC controller 604.

In some embodiments, the configuration data for programming the IC controller 604 may be stored as a resistor configuration storage. For example, a set of resistors may be connected between a set of pins/terminals of the IC controller 604 and power or ground, to create a voltage or current that can be measured by an ADC to produce a binary value to configure one or more parameters of the controller. In other embodiments, the configuration data for programming the IC controller 604 may be provided as a mask ROM or a metal mask. For example, a chip manufacturer can customize a particular batch of IC controller 604 chips by changing the connections of pre-defined internal nodes between a "1" and a "0" using a single lithographic mask that is specific to that custom configuration with other masks remaining unchanged between batches, thereby providing custom configuration parameters for the particular batch of controllers.

It should be understood that various embodiments may provide various types of programmability for an IC controller 604 (and of its components) that operates in accordance with the techniques for overvoltage protection described herein. For example, some embodiments may provide dynamic programmability, in which configuration changes are re-programmed in the course of normal operation of the IC controller 604, usually (but not necessarily always) in response to a change in one or more operating conditions or an external command and based on data previously programmed into the controller. Other embodiments may use in-system programmability, in which configuration changes are re-programmed in the course of normal operation of the IC controller 804 in response to an external command and based on new configuration data downloaded into the controller in association of the command. In some embodiments, the IC controller 804 may be factory-programmed as part of its manufacture or as part of the manufacture of an end product (e.g., such as a power adapter, a wall socket, a car charger, a power bank, etc.). For example, the IC controller 804 may be programmed during manufacture by using various mechanisms such as firmware instructions stored in non-volatile memory, pin-strapping, resistor programming, laser-trimmed fuses, NV latches, or OTP registers.

Unless specifically stated otherwise, terms such as "detecting," "decoupling," "coupling," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "may include", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component.

Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An electronic device, comprising:
    a first switch configured to connect a first sideband use (SBU) terminal of a Universal Serial Bus Type-C (USB-C) controller to a SBU crossbar switch of the USB-C controller, the first SBU terminal configured to be coupled to a USB-C receptacle;
    a second switch configured to connect a second SBU terminal of the USB-C controller to the SBU crossbar switch, the second SBU terminal configured to be coupled to the USB-C receptacle; and
    an overvoltage detection and protection circuit configured to deactivate the first switch or the second switch when a voltage exceeding a predetermined threshold is detected on a respective terminal of the first switch or the second switch, wherein the first switch and the second switch are each coupled to the overvoltage detection and protection circuit.

2. The electronic device of claim 1, wherein the SBU crossbar switch further comprises a flip orientation block coupled to the overvoltage detection and protection circuit, wherein the flip orientation block is configured to determine a plug orientation of the USB-C receptacle.

3. The electronic device of claim 2, wherein the SBU crossbar switch further comprises a selection block coupled to the flip orientation block, wherein the selection block is configured to select between a Display Port mode and a Thunderbolt mode based on the plug orientation determined by the flip orientation block.

4. The electronic device of claim 1, further comprising:
a third switch configured to connect a first configuration channel (CC) terminal of the USB-C controller to a $V_{CONN}$ supply voltage of the USB-C controller; and
a fourth switch configured to connect a second CC terminal of the USB-C controller to a control channel physical layer logic (PHY) of the USB-C controller.

5. The electronic device of claim 4, wherein the first switch, the second switch, the third switch, and the fourth switch each comprises a cascade N-channel field-effect transistor (FET) configured to operate at a voltage no higher than the $V_{CONN}$ supply voltage or a gate oxide breakdown voltage limit.

6. The electronic device of claim 1, further comprising a self-bias control circuit configured to provide bias voltages to the overvoltage detection and protection circuit.

7. The electronic device of claim 1, wherein the predetermined threshold comprises a programmable threshold.

8. A system comprising:
a Universal Serial Bus Type-C (USB-C) receptacle; and
a USB-C controller coupled to the USB-C receptacle, wherein the USB-C controller comprises:
a sideband use (SBU) crossbar switch, a first SBU terminal, and a second SBU terminal;
a first switch configured to connect the first SBU terminal to the SBU crossbar switch;
a second switch configured to connect the second SBU terminal to the SBU crossbar switch; and
an overvoltage detection and protection circuit configured to deactivate the first switch or the second switch when a voltage exceeding a predetermined threshold is detected on a respective terminal of the first switch or the second switch, wherein the first switch and the second switch are each coupled to the overvoltage detection and protection circuit.

9. The system of claim 8, wherein the SBU crossbar switch further comprises a flip orientation block coupled to the overvoltage detection and protection circuit, wherein the flip orientation block is configured to determine a plug orientation of the USB-C receptacle.

10. The system of claim 9, wherein the SBU crossbar switch further comprises a selection block coupled to the flip orientation block, wherein the selection block is configured to select between a Display Port mode and a Thunderbolt mode based on the plug orientation determined by the flip orientation block.

11. The system of claim 8, wherein the USB-C controller further comprises:
a $V_{CONN}$ supply voltage, a control channel physical layer logic (PHY), a first configuration channel (CC) terminal, and a second CC terminal;
a third switch configured to connect the first CC terminal to the $V_{CONN}$ supply voltage; and
a fourth switch configured to connect the second CC terminal to the PHY.

12. The system of claim 11, wherein the first switch, the second switch, the third switch, and the fourth switch each comprises a cascade N-channel field-effect transistor (FET) configured to operate at a voltage no higher than the $V_{CONN}$ supply voltage or a gate oxide breakdown voltage limit.

13. The system of claim 8, wherein the USB-C controller further comprises a self-bias control circuit configured to provide bias voltages to the overvoltage detection and protection circuit.

14. The system of claim 8, wherein the predetermined threshold comprises a programmable threshold.

15. A method comprising:
detecting, by a Universal Serial Bus Type-C (USB-C) controller, an orientation of a plug mated with a USB-C receptacle coupled to the USB-C controller;
coupling a first sideband use (SBU) terminal of the USB-C controller to a SBU crossbar switch of the USB-C controller by using a first switch;
coupling a second SBU terminal of the USB-C controller to the SBU crossbar switch by using a second switch;
detecting, by an overvoltage detection and protection circuit of the USB-C controller, that a voltage on the first SBU terminal or the second SBU terminal is greater than a predetermined threshold; and
in response to detecting that the voltage on the first SBU terminal or the second SBU terminal is greater than the predetermined threshold, deactivating the first switch or the second switch respectively.

16. The method of claim 15, wherein detecting the orientation of the plug is performed by a flip orientation block of the SBU crossbar switch.

17. The method of claim 15, further comprising selecting, by a selection block of the SBU crossbar switch, between a Display Port mode and a Thunderbolt mode based on the orientation of the plug.

18. The method of claim 15, further comprising:
coupling a first configuration channel (CC) terminal of the USB-C controller to a $V_{CONN}$ supply voltage of the USB-C controller by using a third switch; and
coupling a second CC terminal of the USB-C controller to a control channel physical layer logic (PHY) of the USB-C controller by using a fourth switch.

19. The method of claim 18, further comprising:
detecting, by the overvoltage detection and protection circuit, that a voltage on the first CC terminal or the second CC terminal is greater than the predetermined threshold; and
in response to detecting that the voltage on the first CC terminal or the second CC terminal is greater than the predetermined threshold, deactivating the third switch or the fourth switch.

20. The method of claim 15, further comprising providing bias voltages to the overvoltage detection and protection circuit by using a self-bias control circuit of the USB-C controller.

* * * * *